(12) United States Patent
Miranda et al.

(10) Patent No.: US 11,664,079 B2
(45) Date of Patent: May 30, 2023

(54) INTERVALLIC DYNAMIC START VOLTAGE AND PROGRAM VERIFY SAMPLING IN A MEMORY SUB-SYSTEM

(71) Applicant: Micron Technology, Inc., Boise, ID (US)

(72) Inventors: Lawrence Celso Miranda, San Jose, CA (US); Eric N. Lee, San Jose, CA (US); Tong Liu, Boise, ID (US); Sheyang Ning, San Jose, CA (US); Cobie B. Loper, Boise, ID (US); Ugo Russo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/940,338

(22) Filed: Sep. 8, 2022

(65) Prior Publication Data

US 2023/0005553 A1    Jan. 5, 2023

Related U.S. Application Data

(63) Continuation of application No. 17/307,443, filed on May 4, 2021, now Pat. No. 11,462,281.

(51) Int. Cl.
*G11C 16/12* (2006.01)
*G11C 16/34* (2006.01)
*G11C 16/04* (2006.01)
*G11C 16/10* (2006.01)
*G11C 16/06* (2006.01)

(52) U.S. Cl.
CPC ...... *G11C 16/3459* (2013.01); *G11C 16/0483* (2013.01); *G11C 16/10* (2013.01); *G11C 16/06* (2013.01)

(58) Field of Classification Search
CPC .................................................. G11C 16/06
See application file for complete search history.

(56) References Cited

U.S. PATENT DOCUMENTS 10,224,107 B1 *    3/2019    Sule ..................... G11C 16/12

\* cited by examiner

*Primary Examiner* — Jason Lappas
(74) *Attorney, Agent, or Firm* — Lowenstein Sandler LLP

(57) ABSTRACT

Control logic in a memory device executes a first operation comprising a first set of programming pulses and a first set of program verify operations on a first portion of a first subset of memory cells to be programmed to identify a first start voltage level. A second set of programming pulses including at least one programming pulse having the first start voltage level is caused to be applied to program a second portion of the first subset of memory cells. A second operation including a third set of programming pulses and a second set of program verify operations are executed on a first portion of the second subset of memory cells to identify a second start voltage level.

20 Claims, 7 Drawing Sheets

DSV/PV sampled portion

State after Vpgm$_K$

Vpgm_0 for programming remaining pages in WL group X

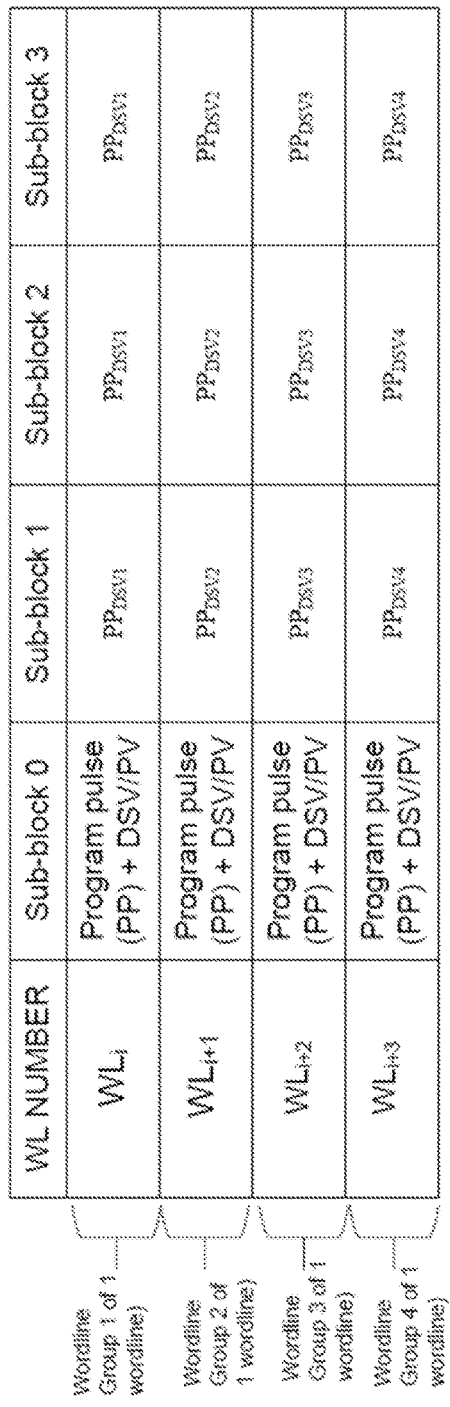
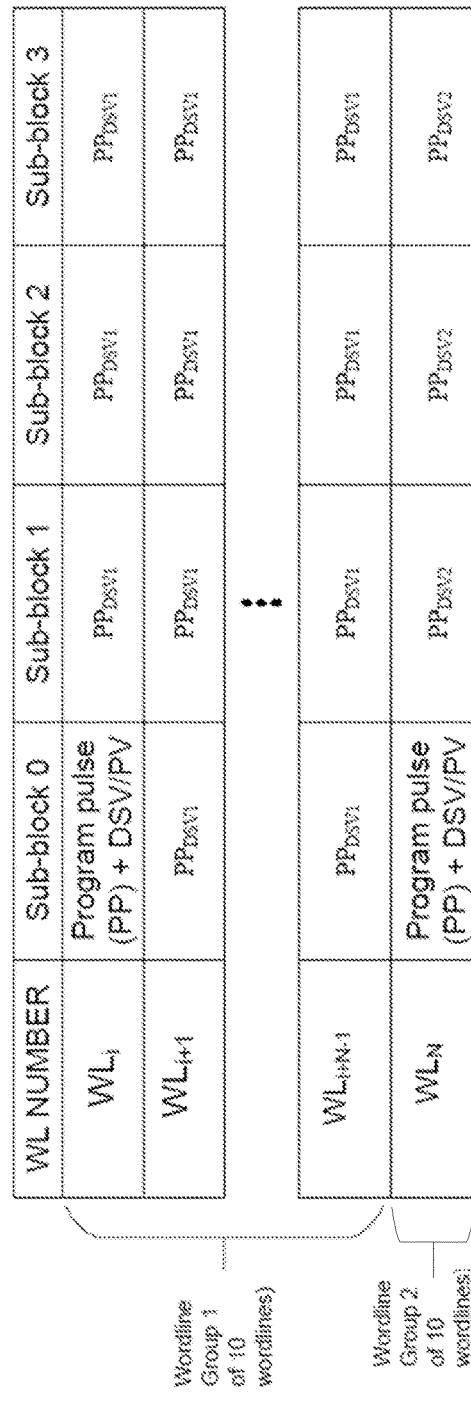

INTERVALLIC DYNAMIC START VOLTAGE AND PROGRAM VERIFY SAMPLING IN A MEMORY SUB-SYSTEM

CROSS-REFERENCE TO RELATED APPLICATION

This application is a continuation of U.S. patent application Ser. No. 17/307,443, filed on May 4, 2021, the entirety of which is hereby incorporated by reference herein.

TECHNICAL FIELD

Embodiments of the disclosure relate generally to memory sub-systems, and more specifically, relate to intervallic dynamic start voltage and program verify sampling in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 6A and 6B illustrate example data structures illustrating operations performed to sample a first portion of respective wordline groups to identify a dynamic start voltage for use in programming a remaining portion of respective wordline groups in accordance with some embodiments of the present disclosure.

DETAILED DESCRIPTION

Figure 1:
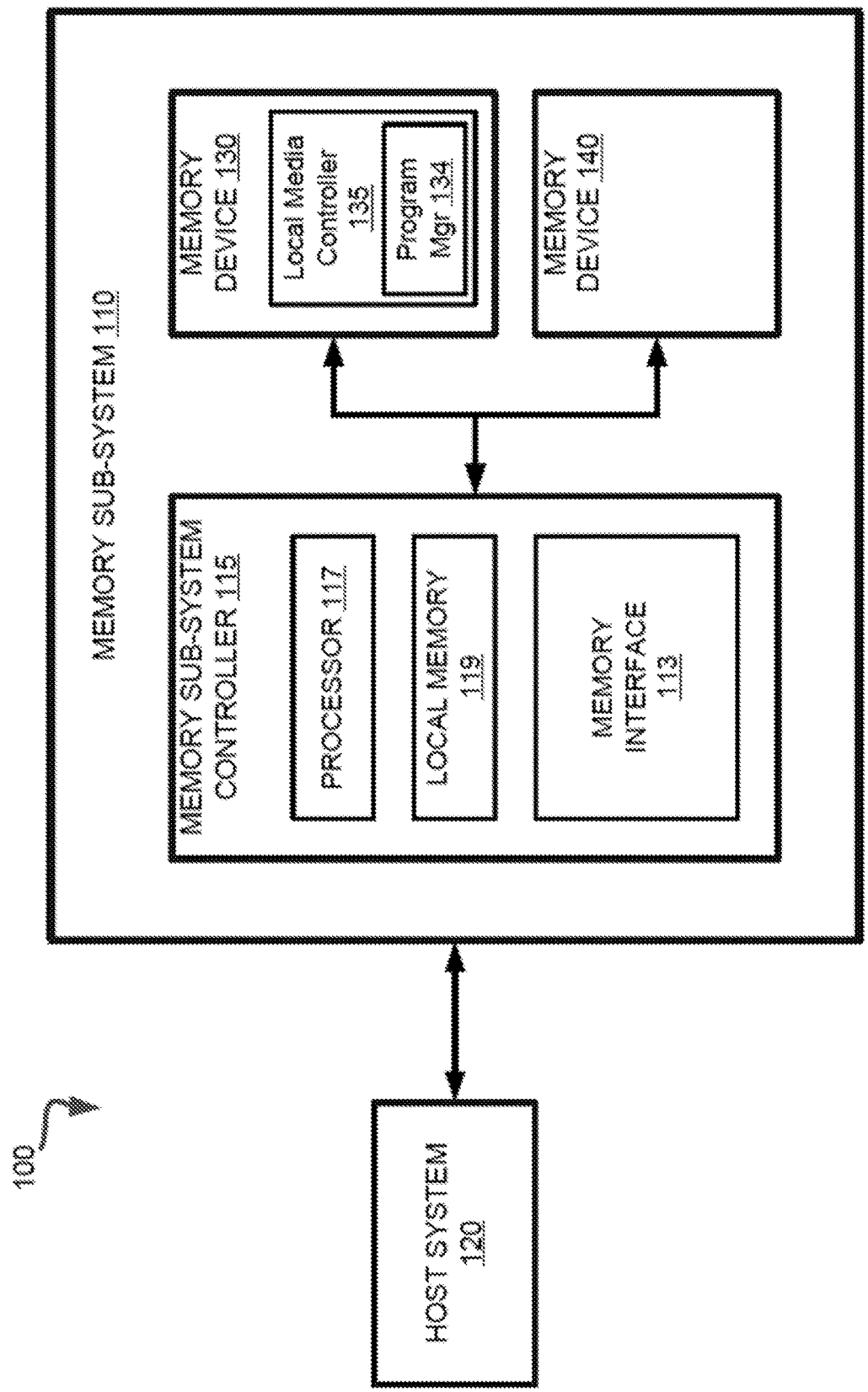
FIG. 1 illustrates an example computing system that includes a memory sub-system in accordance with some embodiments of the present disclosure.

Aspects of the present disclosure are directed to intervallic dynamic start voltage (DSV) and program verify sampling in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks and sub-blocks. Each sub-block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A sub-block hereinafter refers to a unit of the memory device used to store data and can include a group of memory cells, a wordline group, a wordline, or individual memory cells.

A set of one or memory cells of the memory array can be programmed in accordance with a request from a host system. A programming operation can be performed to store information in the one or more of the memory device. During the programming operation, a series of programming pulses are applied to one or more wordlines associated with the memory cells to increase a voltage of the memory cells to a corresponding programming level. A first pulse corresponding to a first programming level is applied to all cells being programmed (e.g., all cells of a wordline). Subsequently, a program verify operation is performed to verify that the memory cells intended to be programmed to the first programming level reached the corresponding target voltage level. Those cells that pass the program verify operation are inhibited while a second pulse corresponding to a second programming level is applied to the remaining cells. Another program verify operation is performed, and this sequence continues with additional pulses and program verify operation until the programming is complete.

During a programming operation of a set of target memory cells (e.g., single-level cells (SLC)), a dynamic start voltage (DSV) process can be initiated to perform a sampling operation on a first page or sub-block corresponding to each wordline to be programmed to identify a dynamic starting voltage (e.g., an initial voltage level) of an initial programming pulse (Vpgm 0) applied to program the remaining pages or sub-blocks of each wordline. The DSV process (e.g., a Continuous-Predictive DSV process or other suitable process for dynamically adjusting a start voltage in connection with a stepped programming pulse process)

includes a sampling operation including the application of a set of programming pulses and associated program verify operations to the sampled portion of memory cells. Based on the results of the sampling operation, offset information (e.g., a voltage offset level, also referred to as a "DSV offset") is determined and used to dynamically adjust a start voltage of an initial programming pulse of a series of programming pulses applied to the one or more wordlines associated with memory cells to be programmed. In this approach, a programming pulse and DSV sampling including a program verify operation is performed with respect to the sampled portion.

Following the identification of the starting voltage for an initial programming pulse, a series of programming pulses are applied and corresponding program verify operations are performed for all of the remaining pages or sub-blocks of each respective wordline. Accordingly, for a given wordline having four sub-blocks (e.g., sub-block 0, sub-block 1, sub-block 2, and sub-block 3), the DSV sampling operation including corresponding program verify operations is applied to each sub-block for the given wordline, followed by the application of a programming pulse associated with an identified DSV level and corresponding program verify operations to all of the memory cells in the remaining sub-blocks (e.g., sub-block 1, sub-block 2, and sub-block 3). The execution of the respective program verify operations for each of the multiple programming pulses for each of the remaining portion of the wordline following the execution of the DSV sampling operation results in an extended time to program (Tprog) associated with the memory device. In addition, consumption of memory sub-system overhead associated with storing a DSV offset for each wordline is increased. Furthermore, this approach and the use of a program verify operations associated with each programming pulses for each wordline results in the over-programming of the memory cells which results in a reduction in the endurance levels due to stresses in the dielectric (e.g., oxide) layers of the memory cells.

Aspects of the present disclosure address the above and other deficiencies by implementing a programming operation including an intervallic dynamic start voltage (DSV) operation and corresponding program verify (PV) operations applied to a portion of a set of target memory cells to be programmed. In an embodiment, the intervallic DSV operation and corresponding set of PV operations are performed on a sampled or first portion (e.g., a first page of a sub-block) of a set of wordlines (e.g., a set of N wordlines). The intervallic DSV operation identifies a starting value for the programming voltage level (Vpgm 0) of programming pulses to apply to a remaining portion (e.g., the sub-blocks or pages) of the wordline group (e.g., group of N wordlines). In an embodiment, the programming pulses at the identified Vpgm are applied without a corresponding program verify operation. In this regard, the program verify operation is skipped during the programming of the remaining pages of the wordline group.

In an embodiment, the DSV is resampled on a first portion of a next wordline group (e.g., due to wordline variation) to recalculate the Vpgm to confirm above program verify levels for the next wordline group. Accordingly, the DSV operation and corresponding PV operations are sampled in an intervallic manner, such that the sampling or resampling of a portion of a group of wordlines is performed on only a first portion of each wordline group. In an embodiment, each group of N wordlines represents a corresponding interval (e.g., portion), wherein the DSV sampling or resampling is performed for a first portion of each group of wordlines.

Advantageously, program verify operations are performed in connection with the sampling of the initial or first portion of a wordline group, and program verify operations can be skipped during the programming of the remaining portion of the wordline group. The skipping of program verify operations results in a reduced time to program without a reduction in the read window budget (i.e., valley margins) corresponding to the programming levels of the memory cells. Advantages of this approach include, but are not limited to, improved performance in the memory subsystem. As fewer program verify operations are performed, the latency associated with program verify start and recovery times is minimized. In addition, the programming operation including the intervallic DSV operation enables the use of a same DSV offset for the entire wordline group which results in a reduction in the system overhead.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of memory device 130. The memory array can include an array of memory cells formed at the intersections of wordlines and bitlines. In one embodiment, the memory cells are grouped into blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, the sub-blocks are configured as SLC memory.

According to embodiments, the program manager 134 is configured to implement a programming operation including an intervallic DSV sampling operation and corresponding program verify (PV) operations applied to a sampled portion (e.g., a first page) of a set of target memory cells to be programmed. In an embodiment, the intervallic DSV sampling operation and corresponding set of PV operations are performed on a sampled or first portion (e.g., a first page of a sub-block) of a set of wordlines (e.g., a wordline group including N wordlines). The program manager 134 executes the intervallic DSV operation to identify a starting value for the programming voltage level ($V_{pgm\_0}$) of programming pulses to apply to a remaining portion (e.g., the sub-blocks or pages) of the wordline group (e.g., group of N wordlines). In an embodiment, the program manager 134 causes programming pulses at the identified $V_{pgm}$ to be applied to the remaining portion of the wordline group (e.g., the remaining pages of the N−1 wordlines in the N wordline group) without a corresponding program verify operation. In this regard, the program manager 134 skips execution of the program verify operations during the programming of the remaining pages of the wordline group.

In an embodiment, the program manager 134 resamples the DSV on a first portion of a next wordline group (e.g., due to wordline variation) to recalculate the $V_{pgm\_0}$ for the next wordline group. Accordingly, the DSV operation and corresponding PV operations are sampled in an intervallic manner, such that the sampling or resampling of a portion of a group of wordlines is performed on only a first portion (e.g., a first page) of each wordline group. In an embodiment, each group of N wordlines represents a corresponding interval (e.g., portion), wherein the DSV sampling or resampling is performed for a first portion of each group of wordlines. Further details with regards to the operations of program manager 134 are described below.

Figure 2:
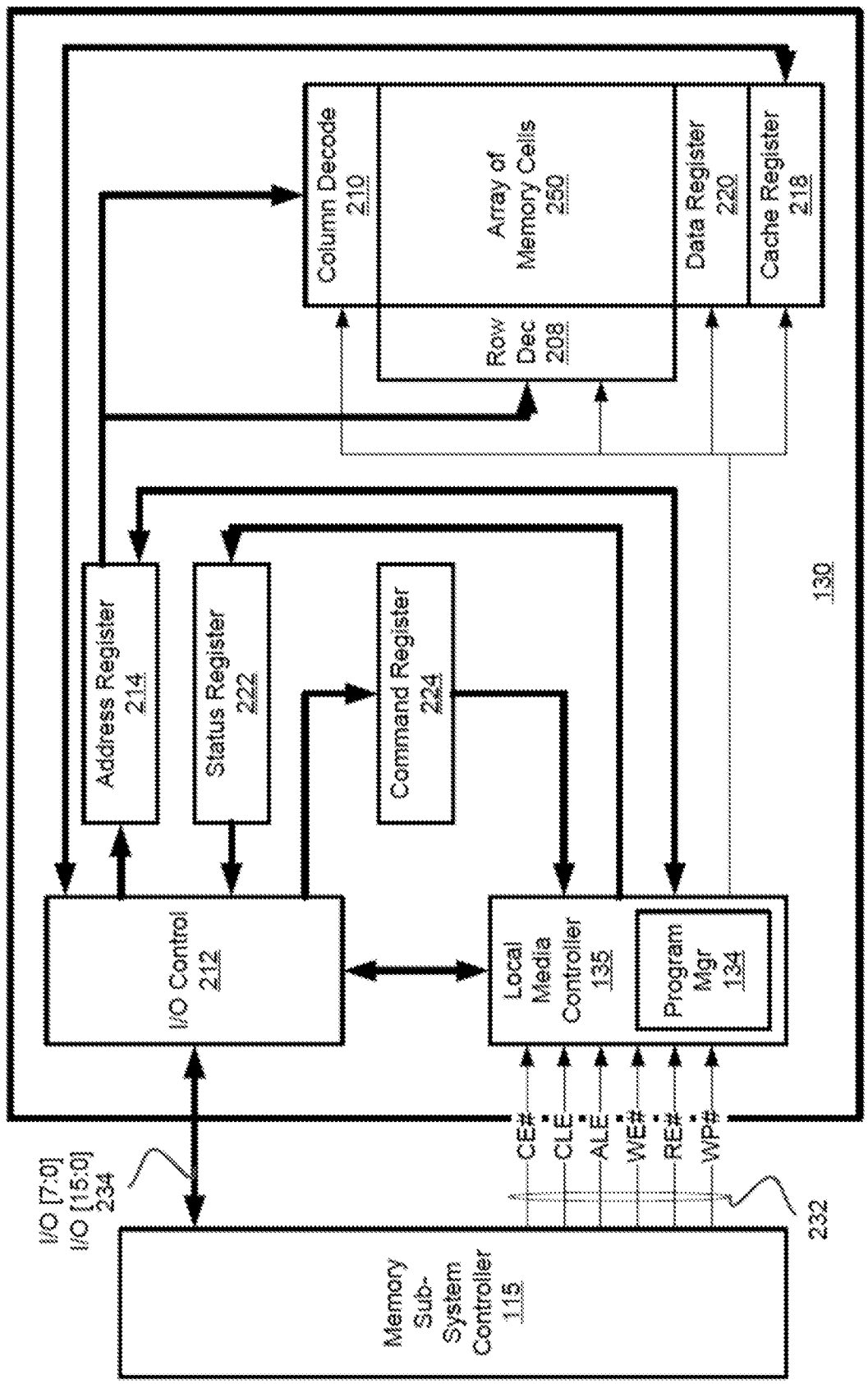
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 250 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 250 are capable of being programmed to one of at least two target data states.

Row decode circuitry 208 and column decode circuitry 210 are provided to decode address signals. Address signals are received and decoded to access the array of memory cells 250. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 250 in response to the commands and generates status information for the external memory sub-system controller 115, i.e., the local media controller 135 is configured to perform access operations (e.g., read operations, programming operations and/or erase operations) on the array of memory cells 250. The local media controller 135 is in communication with row decode circuitry 208 and column decode circuitry 210 to control the row decode circuitry 208 and column decode circuitry 210 in response to the addresses. In one embodiment, local media controller 134 includes program manager 134, which can implement the programming operation including intervallic dynamic start voltage (DSV) sampling of memory device 130, as described herein.

The local media controller 135 is also in communication with a cache register 218. Cache register 218 latches data, either incoming or outgoing, as directed by the local media controller 135 to temporarily store data while the array of memory cells 250 is busy writing or reading, respectively, other data. During a program operation (e.g., write operation), data may be passed from the cache register 218 to the data register 220 for transfer to the array of memory cells 250; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 250, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 250.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
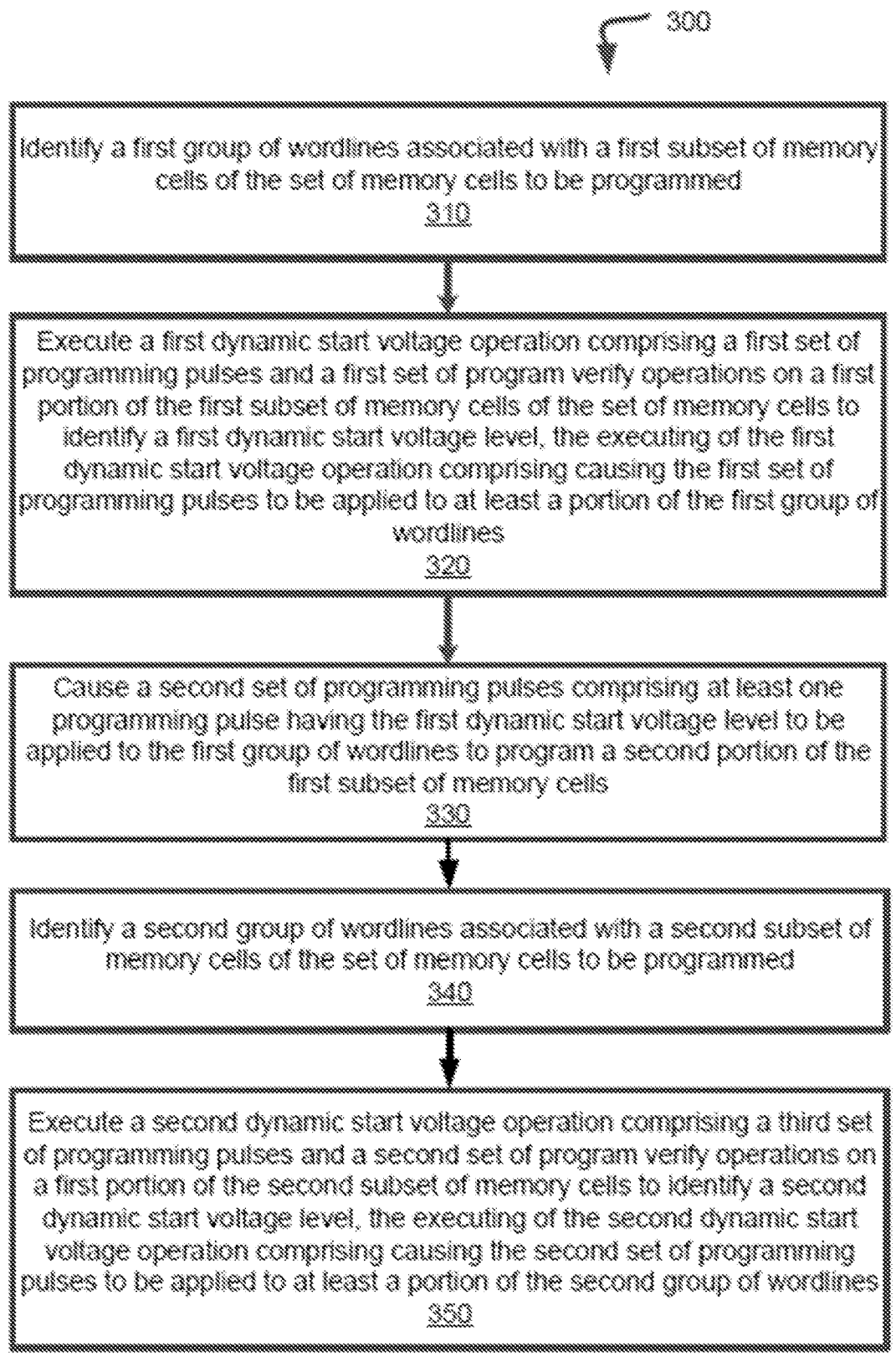
FIG. 3 is a flow diagram of an example method of a dynamic start voltage (DSV) programming of a memory device in a memory sub-system in accordance with some embodiments of the present disclosure.

FIG. 3 is a flow diagram of an example method of programming of a memory device including intervallic dynamic start voltage (DSV) sampling of a portion of a group of wordlines (also referred to as a wordline group) of a memory device in a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by program manager 134 of FIG. 1 and FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, a first group of wordlines is identified. For example, the processing logic identifies the first group of wordlines associated with a first subset of memory cells of the set of memory cells to be programmed. In an embodiment, the processing logic (e.g., program manager 134) can receive, from a requestor, such as a memory interface 113 of a memory sub-system controller 115, a request to perform a memory access operation on a memory array, such as memory array 250, of a memory device, such as memory device 130. In one embodiment, the memory access operation comprises a program operation directed to a specific address. In one embodiment, the processing logic can identify a first group of N wordlines associated with a first subset of memory cells of the set of memory cells to be programmed (e.g., a first subset of the memory cells of memory array 250, such as those memory cells associated with a certain wordline or multiple wordlines of memory array 250). The first group of wordlines can be similar or identical to the exemplary first group of wordlines (WL group 1) of memory block 400 depicted in FIG. 4 and described in greater detail below. In an embodiment, the first subset of memory cells can include the memory cells associated with the first group of wordlines (e.g., WL group 1 shown in FIG. 4). In an embodiment, the first group of wordlines includes a set of N wordlines, wherein N is a predetermined or default non-zero integer (e.g., N=1, N=2 . . . . N=10) value (e.g., a trim value). In one embodiment, the set of memory cells are configured as SLC memory.

Figure 4:
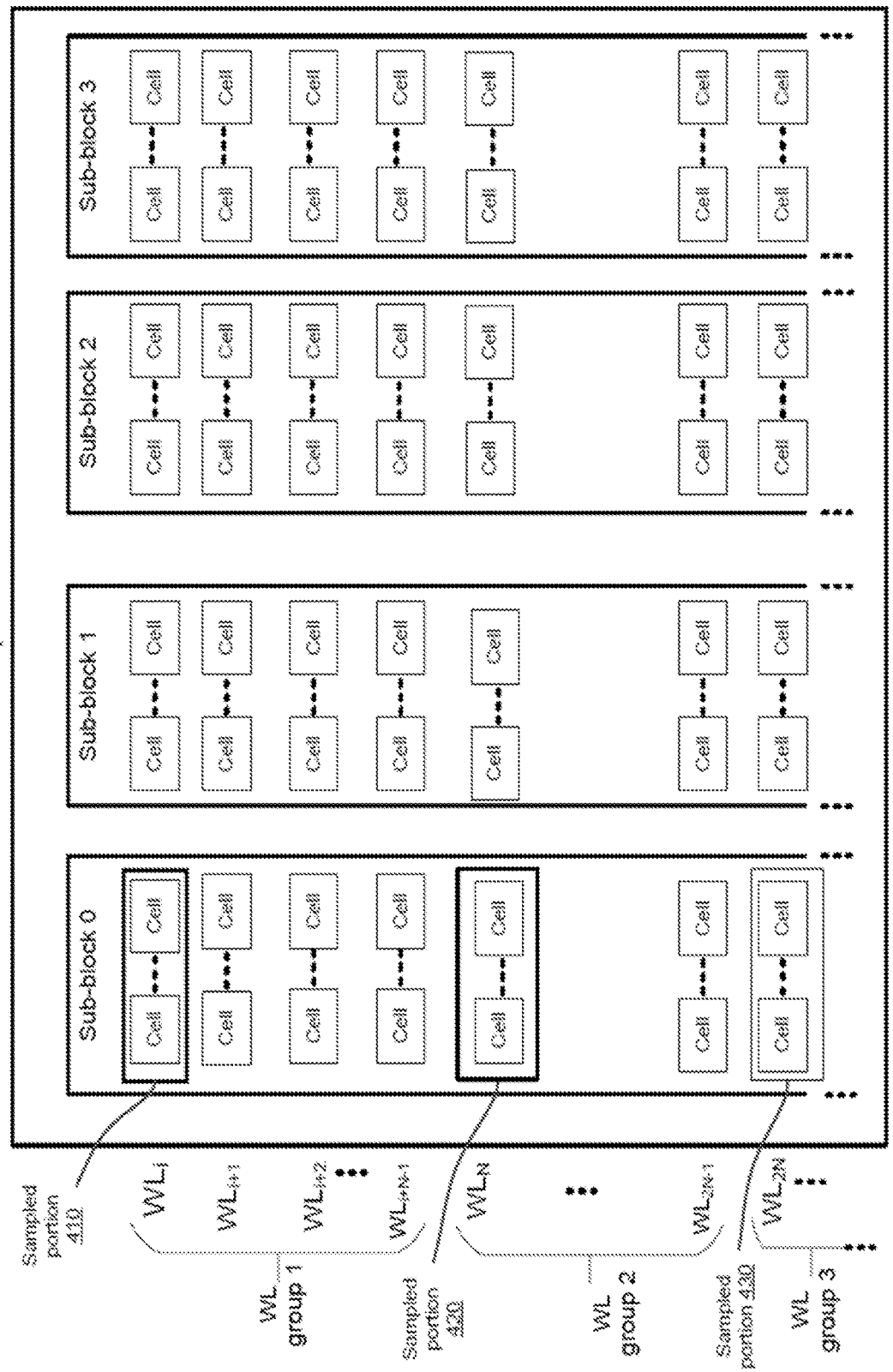
FIG. 4 illustrates a portion of an example memory block of a memory device including multiple sub-blocks of memory cells and multiple wordlines grouped into multiple wordline groups, in accordance with one or more embodiments of the present disclosure.

FIG. 4 illustrates a portion of an example memory block 400 of a memory device including multiple sub-blocks (e.g., sub-block 0, sub-block 1, sub-block 2, and sub-block 3) of memory cells and multiple wordlines (e.g., $WL_i$, $WL_{i+1}$ . . . . $WL_{2N}$) grouped into multiple wordline groups (e.g., WL group 1, WL group 2, WL group 3). In an embodiment, each wordline group can include N wordlines (e.g., N=10). For example, as shown, a first wordline group (WL group 1) includes $WL_i$ to $WL_{i+N-1}$, a second wordline group (WL group 2) includes $WL_N$ to $WL_{2N-1}$, a third wordline group (WL group 3) includes $WL_{2N}$ to $WL_{2N-1}$), and so on.

With reference back to FIG. 3, at operation 320, an operation is executed. For example, the processing logic can execute a first dynamic start voltage (DSV) operation comprising a first set of programming pulses and a first set of program verify operations on a first portion of the first subset of memory cells of the set of memory cells to identify a first DSV level, the executing of the first dynamic start voltage operation comprising causing the first set of programming pulses to be applied to at least a portion of the first group of wordlines. In an embodiment, the processing logic executes the first DSV operation to determine the programming pulse magnitudes for subsequent programming events. In an embodiment, the determined programming pulse magnitude is, for example, a first DSV level (Vpgm_0) to be used for the subsequent programming events. In an embodiment, the first DSV sampling operation is executed using a first portion of the first group of wordlines to determine the first DSV level. For example, a first set of programming pulses and a first set of PV operations are applied using the first portion of the first group of wordlines to determine the first DSV level. As later described at operation 330, the determined first DSV level is used to program a second portion of the first subset of memory cells associated with the one or more remaining portions of the first group of wordlines.

In an embodiment, as shown in FIG. 4, the first portion of the first subset of memory cells includes memory cells of a first page of the first wordline group. As shown, the first portion of the first subset of memory cells (also referred to as a "sampled portion") includes memory cells in sub-block 0 associated with $WL_i$ of WL group 1 410. In an embodiment, the sampled portion 410 of the first wordline group (WL group 1) corresponds to a first page of the first wordline group (WL group 1).

Figure 5A:
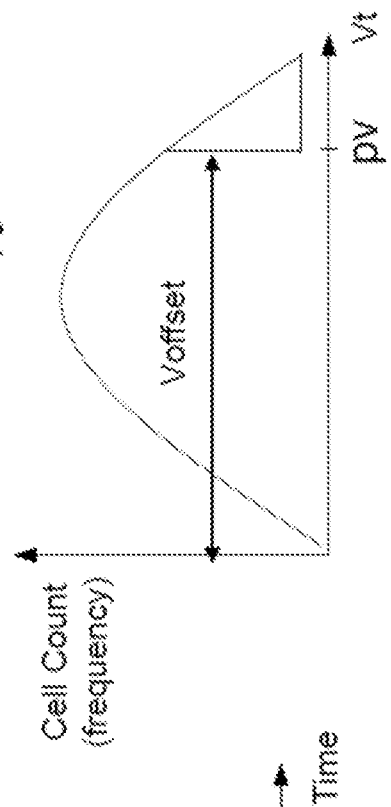
FIGS. 5A-5C illustrate an example dynamic start voltage (DSV) sampling operation and identification a use of an identified DSV to a remaining portion of a wordline group in accordance with some embodiments of the present disclosure.
Figure 5B:
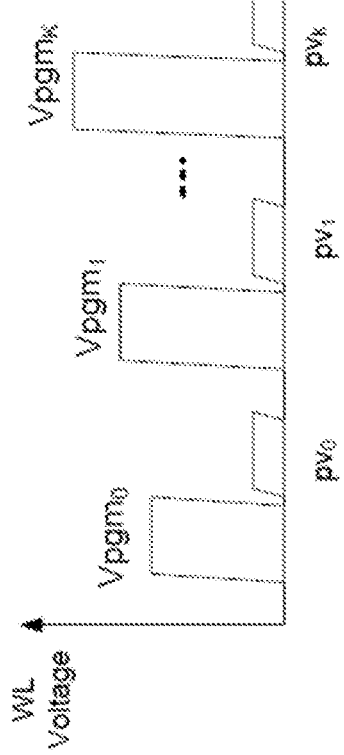

FIGS. 5A and 5B illustrate a more detailed example of the first DSV operation described above. As shown, the first DSV operation includes a first set of programming pulses (e.g., $Vpgm_0$, $Vpgm_1$, $Vpgm_k$) and corresponding program verify operations ($pv_0$, $pv_1$ . . . $pv_k$). In an embodiment, as shown in FIG. 5A, the DSV operation is executed on a subset of memory cells (e.g., the first subset of memory cells described above). For example, with reference to FIGS. 4 and 5A, the illustrated DSV sampling operation is applied to the first sampled portion 410 including memory cells associated with WL group 1 (e.g., memory cells of a first page of WL group 1). As shown in FIG. 5A, the DSV operation includes the application of a series of programming pulses having stepped programming voltage levels (e.g., $Vpgm_0$, $Vpgm_1$, $Vpgm_k$)

Figure 5C:
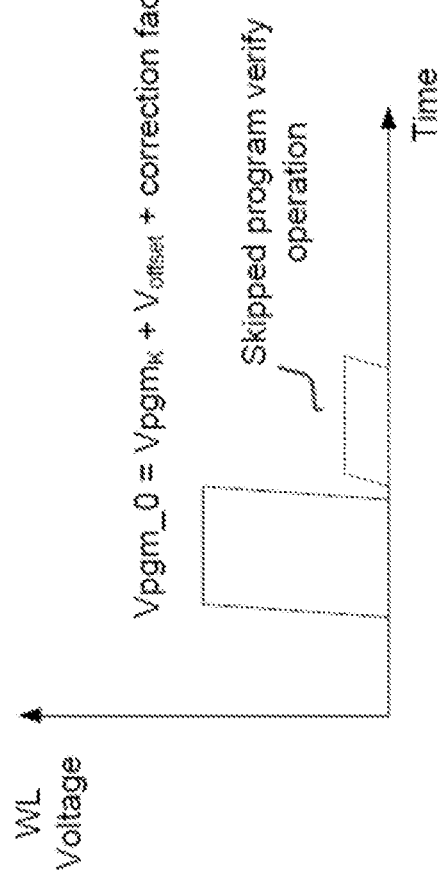

In an embodiment, the processing logic can perform the DSV operation to determine the value for Voffset (e.g. offset voltage), wherein Voffset is the offset information that the processing logic can use to adjust (e.g., increase or decrease) the value of the first DSV level (e.g., voltage Vpgm_0) of a first programming pulse for a subsequent program event (e.g., the programming of the remaining pages in WL group X, as shown in FIG. 5C). In an embodiment, the processing logic determines Voffset based on a count value of the memory cells subjected to the first DSV operation (e.g., a count value of memory cells of the sampled portion 410 of FIG. 4, such as, for example, the memory cells in page 1 of sub-block 0 that passed a corresponding program verify level (e.g., using a suitable technique, such as a continuous-predictive DSV approach)). In an embodiment, the processing logic identifies the first DSV level (Vpgm_0) corresponding to the satisfaction of a condition. In an embodiment, the condition is satisfied if a number of memory cells subjected to the first DSV operation having a threshold voltage (Vt) above the program verify level (e.g., a number of cells that passed) is greater than a threshold count level.

For example, as shown in FIGS. 5A and 5B, the condition is satisfied (e.g., the cell count of the sampled portion of memory cells associated with WL group X is greater than or equal to the cell count threshold) following the application of a programming pulse $Vpgm_k$. In an embodiment, the processing logic identifies the Voffset corresponding to the state of the sampled portion following the application of the programming pulse k at the $Vpgm_k$ level. In an embodiment, the Voffset corresponds to a threshold voltage (Vt) level for which the program verify operation identifies a cell count passed memory cells is greater than or equal to the threshold level (e.g., a threshold cell count).

Determining the magnitude of programming pulses at operation 320 includes, for example, the processing logic determining (e.g., identifying) the first DSV level (Vpgm_0) for subsequently programming the remaining portion of the WL group X, as shown in FIGS. 5A-5C. Particularly, in this example, Vpgm_0 is calculated in accordance with the following expression:

$$Vpgm\_0 = Vpgm_K + V_{offset} + \text{correction factor}(CF);$$

wherein the correction factor is a factor used to adjust for wordline variation. In an embodiment, the correction factor (CF) can be used to tune the Vpgm in view of a variation of a ration of a gate voltage (Vg) and Vt in the N group of wordlines. In an embodiment, the correction factor can be determined using a linear interpolation to compensate for expected VgVt variation within a group of N wordlines. In an embodiment, the correction factor can determined based on a slope of VgVt. In an embodiment, the correction factor can be expressed as follows:

$$CF = -dVgVt/N$$

In an embodiment, the Vpgm_0 identified for use in programming the remaining pages in WL group can be determined either using the CF or without using the CF.

Returning to FIG. 3, at operation 330, programming pulses are applied. For example, the processing logic can cause a second set of programming pulses including at least one programming pulse having the first DSV level to be applied to the first group of wordlines to program a second portion of the first subset of memory cells. In an embodiment, the at least one programming pulse having the first DSV level (Vpgm_0, determined at operation 320) to be applied to each wordline of a second portion of the first group of wordlines. In the example shown in FIG. 4, the first DSV level (Vpgm_0) is applied to WL group 1 to program a second portion of the first subset of memory cells (e.g., the memory cells of the remaining pages of the sub-blocks associated with the N wordlines in the first group of wordlines (WL group 1)).

In an embodiment, operation 330 is performed with respect to the programming of the remaining memory cells of the first subset memory cells without execution of a corresponding program verify operation. As denoted by the dashed line in FIG. 5C, a program verify operation is skipped in connection with the application of the set of programming pulses when programming the remaining memory cells associated with the particular group of wordlines (e.g., WL group X). Advantageously, the skipping of the program verify operations for the remaining memory cells associated with the wordline group results in an reduction in time-to-program and an improvement in endurance of the memory cells. In an embodiment, no program verify operations are performed during a first time period during which the remaining portion of the memory cells associated with the first wordline group are programmed.

At operation 340, a second group of wordlines is identified. For example, the processing logic identifies the second group of wordlines associated with a second subset of memory cells of the set of memory cells to be programmed. In one embodiment, the processing logic can identify a second group of N wordlines associated with the second subset of memory cells of the set of memory cells to be programmed (e.g., a second subset of the memory cells of memory array 250, such as those memory cells associated with a certain wordline or multiple wordlines of memory array 250). The second group of wordlines can be similar or identical to the exemplary second group of wordlines (WL group 2) of memory block 400 depicted in FIG. 4 and described in greater detail below. In an embodiment, the second subset of memory cells can include the memory cells associated with the first second group of wordlines (e.g., WL group 2 shown in FIG. 4). In an embodiment, the second group of wordlines includes a set of N wordlines (e.g., $WL_N$ through $WL_{2N-1}$), wherein N is a predetermined or default non-zero integer (e.g., N=1, N=2 . . . . N=10) value (e.g., a trim value).

At operation 350, an operation is executed. For example, the processing logic can execute a second DSV operation including a third set of programming pulses and a second set of program verify operations on a first portion of the second subset of memory cells to identify a second dynamic start voltage level, the executing of the second DSV operation including causing the second set of programming pulses to be applied to at least a portion of the second group of wordlines. In an embodiment, the processing logic executes the second DSV operation to determine the programming pulse magnitudes for subsequent programming events. In an embodiment, the determined programming pulse magnitude is, for example, a second DSV level to be used for the subsequent programming events. In an embodiment, the first DSV sampling operation is executed using a first portion of the second group of wordlines to determine the first DSV level. For example, a third set of programming pulses and a second set of PV operations are applied using the first portion of the second group of wordlines to determine the second DSV level. In an embodiment, the determined second DSV level is used to program a second portion of the second subset of memory cells associated with the one or more remaining portions of the second group of wordlines.

In an embodiment, as shown in FIG. 4, the first portion of the second group of wordlines (WL group 2) includes memory cells in sub-block 0 associated with the second group of wordlines. As shown, the first portion or sampled portion 420 includes a portion of a second subset of memory cells associated with WL group 2 (e.g., memory cells in sub-block 0 associated with $WL_N$). As shown in FIG. 4, the second group of wordlines includes $WL_N$ to $WL_{2N-1}$ (e.g., a second set or group of N wordlines). In an embodiment, the sampled portion 420 of the second wordline group (WL group 2) corresponds to a first page of the second wordline group (WL group 2).

In an embodiment, the processing logic performs a new DSV operation for each wordline group (e.g., WL group 1, WL group 2, WL group 3, and so on in FIG. 4). In an embodiment, a first DSV operation is performed for a portion of WL group 1, a second DSV operation is performed for a portion of WL group 2, a third DSV sampling operation is performed for a portion of WL group 3, and so on until a DSV level (Vpgm_0) has been identified for each respective wordline group. Advantageously, the DSV operation and corresponding program verify operation are performed with respect to only the sampled portion of memory cells associated with each wordline group, enabling the avoidance of the execution of further program verify operations in connection with the programming of the remaining portions of the memory cells associated with each of the wordline groups.

FIGS. 6A and 6B illustrate data structures (e.g., tables) showing the operations performed with respect to programming the set of memory cells associated with the respective wordlines of each wordline group having N wordlines. In the example shown in FIG. 6A, N=1 (e.g., the wordline group includes 1 wordline). In the example shown in FIG. 6B, N=10 (e.g., the wordline group includes 10 wordlines). As shown in FIG. 6A, for a first portion of a first subset of memory cells (e.g., memory cells in a first page or sub-block 0 of $WL_i$), the processing logic causes one or more programming pulses (PP) to be applied as part of a DSV operation (DSV/PV) to identify the DSV level (Vpgm_0) for use in programming the remaining portion of the wordlines in each wordline group. For example, for $WL_i$ in FIG. 6A, the DSV sampling operation executed with respect to sub-block 0 determines a Vpgm_0 (a first DSV voltage level or DSV1) that is used for the programming pulses (PP) for sub-block 1, sub-block 2, and sub-block 3 (e.g., the remaining portion) of the wordline group 1 (i.e., $PP_{DSV1}$). As shown in FIG. 6A, a second DSV operation (e.g., a re-sampling) is executed for a first portion (e.g., memory cells in a first page or sub-block 0 of $WL_{i+1}$) of the second wordline group to identify a second DSV level (e.g., DSV2) that is used for the programming pulses (PP) for sub-block 1, sub-block 2, and sub-block 3 (e.g., the remaining portion) of the wordline group 2 (i.e., $PP_{DSV2}$). In an embodiment, the sampling or re-sampling operations are performed for each first portion of memory cells associated with each respective wordline group to identify the DSV level to be used for the programming pulses applied to the remaining portion of memory cells associated with each respective wordline group, without the execution of corresponding program verify operations.

FIG. 6B illustrates another example of a wordline group having 10 wordlines (e.g., N=10). As shown, the DSV operation is applied to the first portion of the wordline group (WL group 1 including $WL_i$ to $Wl_{i+N-1}$) (e.g., the memory cells of sub-block 0 (the first page) of $WL_i$). In this example, the DSV operation identifies a starting voltage (e.g., DSV1) to be used for the programming pulses (PP) for programming the remainder of memory cells associated with WL group 1 (e.g., the memory cells of sub-block 1 to sub-block 3 of $WL_i$ and all sub-blocks of $WL_{i+1}$ through $WL_{i+N-1}$). As shown in FIG. 6B, a second DSV operation is performed for a first portion of the second group of wordlines (e.g., a second group of 10 wordlines starting with $WL_N$). In an embodiment, the programming of the wordlines in each of the respective wordline groups continues until the programming operation is completed. In an embodiment, the DSV operation and corresponding program verify operations are executed on a first portion of the subset of memory cells associated with each wordline group, such that execution of program verify operations can be skipped or eliminated when programming to the remaining portion of the subset of memory cells associated with each wordline group.

Figure 7:
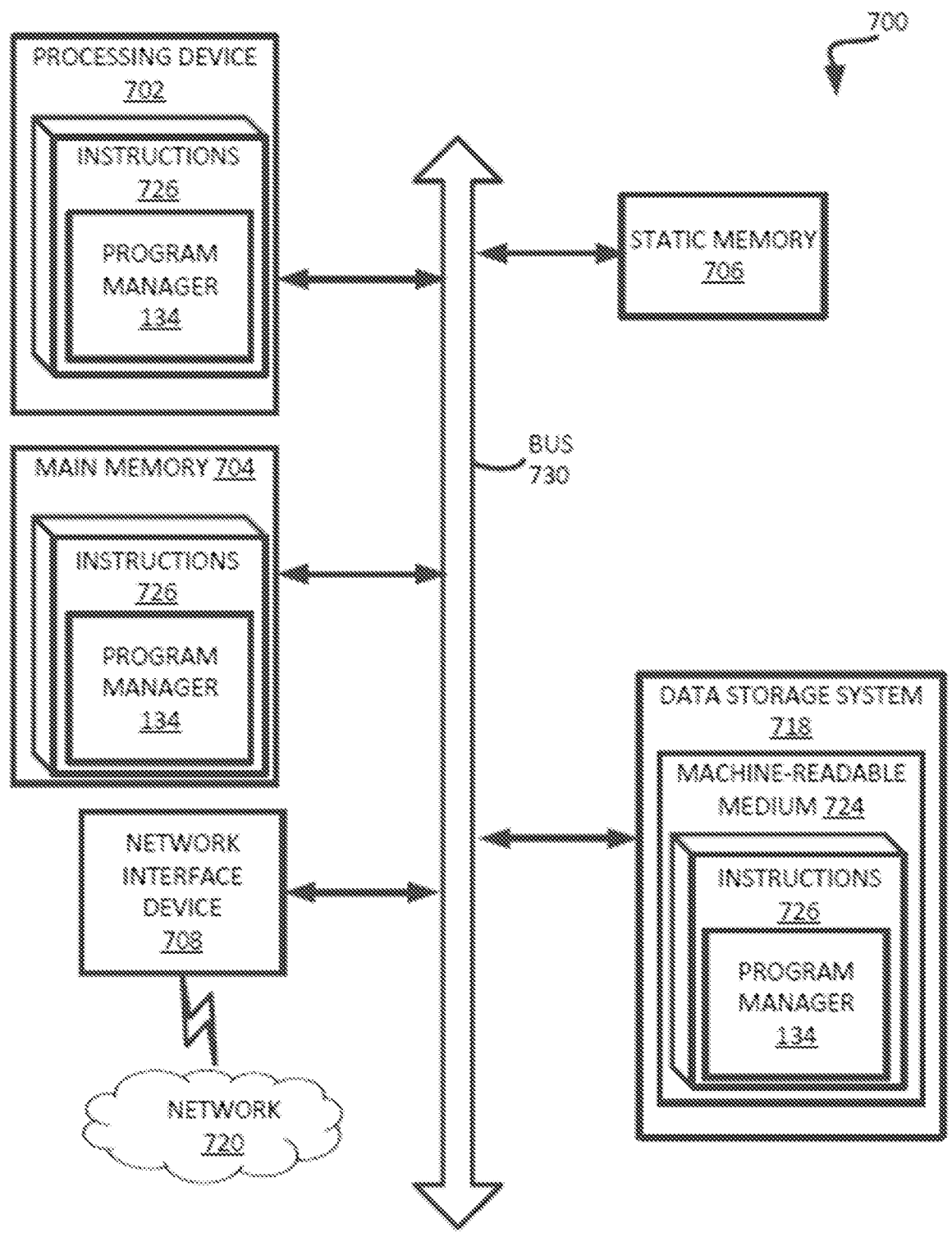
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium, such as a non-transitory computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to program manager 114 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
 a memory array comprising a set of memory cells; and
 control logic, operatively coupled with the memory array, to perform operations comprising:
  executing a first operation comprising a first set of programming pulses and a first set of program verify operations on a first portion of a first subset of memory cells to be programmed to identify a first start voltage level;
  causing a second set of programming pulses comprising at least one programming pulse having the first start voltage level to be applied to program a second portion of the first subset of memory cells; and
  executing a second operation comprising a third set of programming pulses and a second set of program verify operations on a first portion of a second subset of memory cells to identify a second start voltage level.

2. The memory device of claim 1, wherein the first set of program verify operations are executed to verify that the first portion of the first subset of memory cells of the set of memory cells are programmed to respective programming levels of a plurality of programming levels.

3. The memory device of claim 1, wherein a program verify operation is not executed during application of the second set of programming pulses to a first group of wordlines to program the second portion of the first subset of memory cells of the set of memory cells.

4. The memory device of claim 1, wherein the first operation comprises identifying the first start voltage level based on a first voltage offset and a first correction factor corresponding to the first portion of the first subset of memory cells of the set of memory cells.

5. The memory device of claim 1, wherein the first portion of the first subset of memory cells comprises a first page associated with a first wordline of a first group of wordlines.

6. The memory device of claim 1, the operations further comprising:
 causing a fourth set of programming pulses comprising at least one programming pulse having the second start voltage level to be applied to a first group of wordlines to program a second portion of the second subset of memory cells of the set of memory cells.

7. The memory device of claim 6, wherein a program verify operation is not executed during application of the fourth set of programming pulses to a second group of wordlines to program the second portion of the second subset of memory cells of the set of memory cells.

8. A method comprising:
 executing a first operation comprising a first set of programming pulses and a first set of program verify operations on a first portion of a first set of memory cells to be programmed to identify a first start voltage level;
 causing a second set of programming pulses comprising at least one programming pulse having the first start voltage level to be applied to program a second portion of the first set of memory cells; and
 executing a second operation comprising a third set of programming pulses and a second set of program verify operations on a first portion of a second set of memory cells to identify a second start voltage level.

9. The method of claim 8, wherein the first set of program verify operations are executed to verify that the first portion of the first set of memory cells are programmed to respective programming levels of a plurality of programming levels.

10. The method of claim 8, wherein a program verify operation is not executed during application of the second set of programming pulses to a first group of wordlines to program the second portion of the first set of memory cells.

11. The method of claim 8, wherein the first operation comprises identifying the first start voltage level based on a first voltage offset and a first correction factor corresponding to the first portion of the first set of memory cells.

12. The method of claim 8, wherein the first portion of the first set of memory cells comprises a first page associated with a first wordline of a first group of wordlines.

13. The method of claim 8, further comprising causing a fourth set of programming pulses comprising at least one programming pulse having the second start voltage level to be applied to a first group of wordlines to program a second portion of the second set of memory cells.

14. The method of claim 13, wherein a program verify operation is not executed during application of the fourth set of programming pulses to a second group of wordlines to program the second portion of the second set of memory cells.

15. A non-transitory computer-readable storage medium comprising instructions that, when executed by a processing device, cause the processing device to perform operations comprising:
 executing a first operation comprising a first set of programming pulses and a first set of program verify operations on a first portion of a first set of memory cells to be programmed to identify a first start voltage level;

causing a second set of programming pulses comprising at least one programming pulse having the first start voltage level to be applied to program a second portion of the first set of memory cells; and executing a second operation comprising a third set of programming pulses and a second set of program verify operations on a first portion of a second set of memory cells to identify a second start voltage level.

16. The non-transitory computer-readable storage medium of claim 15, wherein the first set of program verify operations are executed to verify that the first portion of the first set of memory cells are programmed to respective programming levels of a plurality of programming levels.

17. The non-transitory computer-readable storage medium of claim 15, wherein a program verify operation is not executed during application of the second set of programming pulses to a first group of wordlines to program the second portion of the first set of memory cells.

18. The non-transitory computer-readable storage medium of claim 15, wherein the first operation comprises identifying the first start voltage level based on a first voltage offset and a first correction factor corresponding to the first portion of the first set of memory cells.

19. The non-transitory computer-readable storage medium of claim 15, wherein the first portion of the first set of memory cells comprises a first page associated with a first wordline of a first group of wordlines.

20. The non-transitory computer-readable storage medium of claim 15, the operations further comprising:

causing a fourth set of programming pulses comprising at least one programming pulse having the second start voltage level to be applied to a first group of wordlines to program a second portion of the second set of memory cells, wherein a program verify operation is not executed during application of the fourth set of programming pulses to a second group of wordlines to program the second portion of the second set of memory cells.

* * * * *